United States Patent [19]

Davis

[11] 3,772,097

[45] Nov. 13, 1973

[54] EPITAXIAL METHOD FOR THE FABRICATION OF A DISTRIBUTED SEMICONDUCTOR POWER SUPPLY CONTAINING A DECOUPLING CAPACITOR

[75] Inventor: Stanley P. Davis, Cupertino, Calif.

[73] Assignee: Motorola, Inc., Franklin Park, Ill.

[22] Filed: July 13, 1970

[21] Appl. No.: 61,040

Related U.S. Application Data

[62] Division of Ser. No. 637,144, May 9, 1967, Pat. No. 3,538,397.

[52] U.S. Cl. .................... 148/175, 29/577, 117/201, 148/187, 148/191, 317/235

[51] Int. Cl. .......................... H01l 7/36, H01l 19/00

[58] Field of Search .................... 148/174, 175, 187, 148/191; 317/234, 235; 117/201; 29/577, 578

[56] References Cited

UNITED STATES PATENTS

| | | | |
|---|---|---|---|
| 3,327,182 | 6/1967 | Kisinko | 317/235 |
| 3,335,341 | 3/1964 | Lin | 317/235 |
| 3,381,188 | 4/1968 | Zuleeg et al. | 317/235 |
| 3,404,450 | 10/1968 | Karcher | 148/175 X |
| 3,423,650 | 1/1969 | Cohen | 317/234 |
| 3,430,110 | 2/1969 | Goshgarian | 317/234 |

*Primary Examiner*—L. Dewayne Rutledge
*Assistant Examiner*—W. G. Saba
*Attorney*—Mueller, Aichele & Gillman

[57] ABSTRACT

A monolithic semiconductor structure and method of making same and in which structure supply voltages are distributed through adjacent P and N type layers to surface regions of the structure. These voltages are available for integrated circuits and other devices which are constructed in the surface regions of the structure. Good capacitive decoupling is provided between the P and N layers used to distribute voltages and a relatively high capacitive reactance at the surface region prevents AC short circuits at high frequencies.

5 Claims, 22 Drawing Figures

EPITAXIAL METHOD FOR THE FABRICATION OF A DISTRIBUTED SEMICONDUCTOR POWER SUPPLY CONTAINING A DECOUPLING CAPACITOR

This application is a division of application Ser. No. 637,144, filed May 9, 1967, now U.S. Pat. No. 3,538,397.

This invention relates generally to voltage distribution systems for integrated circuits and more particularly to a voltage distribution system constructed as a monolithic semiconductor structure. This invention also relates to a method for making the structure.

The present invention is embodied in a structure which includes semiconductor layers which are used for distributing voltages and other layers in which transistors and other semiconductor devices are constructed to form integrated circuits. The words "system" and "integrated circuit" may be used interchangeably herein since the monolithic semiconductor structure to be described is both a voltage distribution system and an integrated circuit.

BACKGROUND OF THE INVENTION

When many semiconductor devices are constructed in a monolithic semiconductor structure having layers which are used for distributing supply voltages and other layers in which the semiconductor devices are built, it becomes necessary to provide compatible electrical coupling between the various layers of the structure. For example, the layers of the structure which are used to distribute supply voltages should have a relatively high capacitance therebetween to produce good decoupling, and other layers of the structure should have negligible capacitive coupling therebetween to prevent AC short circuits at high frequencies. The structure according to this invention is constructed to have both of these features and requires no capacitors which are external to the structure itself.

SUMMARY OF THE INVENTION

An object of this invention is to provide an improved monolithic semiconductor structure for distributing supply voltages.

Another object of this invention is to provide an improved voltage distribution system for integrated circuits wherein the system and circuits are combined in a single structure.

Another object of this invention is to provide good capacitive decoupling between certain regions of the monolithic semiconductor structure and a high capacitive reactance between other regions of the structure.

Another object of this invention is to provide a novel method for making the structure.

This invention features a high capacitance PN junction between the P type and N type regions within the semiconductor structure which are used for distributive voltages. This high capacitance PN junction provides good capacitive decoupling between these regions and prevents adverse electrical interference between same.

Another feature of this invention is the provision of a low capacitance PN junction between adjacent semiconductor layers within the structure in which transistors and other semiconductor devices are constructed.

Briefly described, the present invention is embodied in a semiconductor structure and process for fabricating same wherein initially a relatively low resistivity first region of one conductivity type semiconductor material is formed in a semiconductor substrate. Thereafter, a second region of opposite conductivity type semiconductor material is formed on the surface of the substrate and on the surface of the first region. Next, a third region of the one conductivity type semiconductor material, also of relatively low resistivity, is diffused through the second region and into the first region to form a first continuous band of one conductivity type semiconductor material which extends normal to the substrate. Subsequent diffusions of the opposite conductivity type semiconductor material into the surface of the structure and into the second region produce a second band of opposite conductivity type semiconductor material. These first and second bands are used to distribute voltages from within the semiconductor structure to the surface thereof making available at the surface of the structure bias voltages which may be applied to transistors and other semiconductor devices constructed in the surface regions of the structure. The second region of opposite conductivity type semiconductor material is a graded region, having a first portion of relatively low resistivity semiconductor material adjacent to substrate to provide good capacitive decoupling thereat and having a second portion of relatively high resistivity semiconductor material. This second portion prevents AC shorting between the surface regions of the structure in which semiconductor devices and integrated circuits are built.

DETAILED DESCRIPTION OF THE PREFERRED EMBODIMENTS

Figure 1:
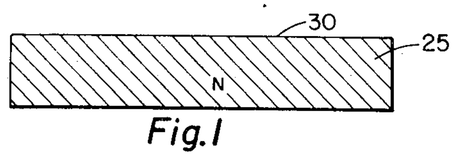
FIGS. 1 to 3 illustrate the formation of a first region of N+ semiconductor material.
Figure 2:
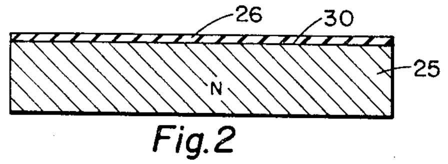
Figure 3:
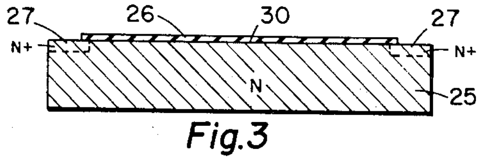

Referring in detail to the accompanying drawings, there is shown in FIG. 1 an N type semiconductor substrate 25 which is the starting material for the process to be described below. For ease of illustration, the description of this process will refer to the construction of a single structure (FIG. 20), but it will be understood by those skilled in the art that many of these structures can be built simultaneously using the process according to this invention. FIG. 2 shows a protective oxide coating 26 which has been formed on the surface 30 of the substrate 25, and in FIG. 3 the oxide has been cut in order to diffuse a first region 27 of one conductivity type, i.e., N+, into the surface of the N type substrate 25.

Figure 4:
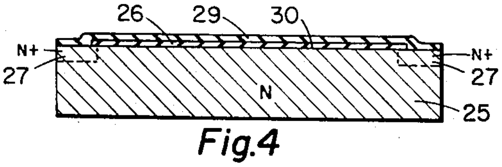
FIGS. 4 and 5 illustrate the formation of a plurality of spaced regions which form concentric rings and are also referred to as "plugs"
Figure 5:
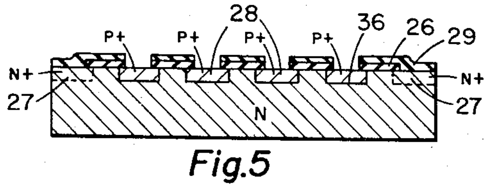

After the formation of region 27, another layer of oxide 29 is grown over the original oxide coating 26 and over the surface areas of region 27 as shown in FIG. 4. Subsequently, the oxide coating is again cut (FIG. 5) to permit the formation, i.e., diffusion, of a plurality of spaced regions 28 and 36 in the substrate 25.

Figure 6:
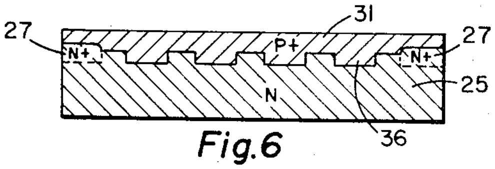
FIG. 6 illustrates the formation of an epitaxial first portion (P+) of the graded, opposite conductivity P type second region (see FIG. 9)
Figure 9:
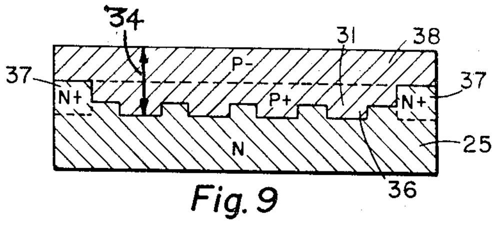
FIG. 9 illustrates the formation of a second portion (P−) of the second region of the semiconductor structure.

After the spaced closed regions 28 and 36 have been formed as shown, a P+ layer of silicon is epitaxially grown as illustrated in FIG. 6 to form a relatively low resistivity first portion 31 of the graded, P type buried region 34 (FIG. 9).

Figure 7:
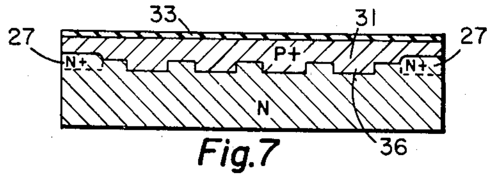
FIGS. 7 and 8 illustrate the formation of a third region of N+ conductivity which diffuses into the first region to form a closed N+ outer band.
Figure 8:
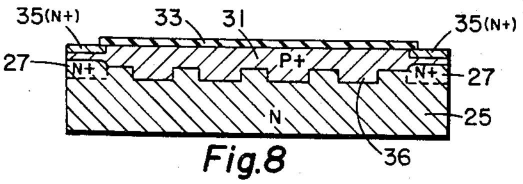

A layer of silicon dioxide 33 is then formed over the P+ layer as shown in FIG. 7 and is subsequently cut as shown in FIG. 8 to permit the diffusion of a third region 35 of N+ conductivity.

The region 35 is diffused inwardly and meets region 27 which diffuses outwardly to form a continuous N+ band 37 as shown in FIG. 9. Next, the oxide coating 33 is removed from the structure shown in FIG. 8 and a second portion 38 of relatively high resistivity (P−) semiconductor material is epitaxially grown on the first portion 31 to complete the second region 34 of graded P type (opposite) conductivity.

Figure 10:
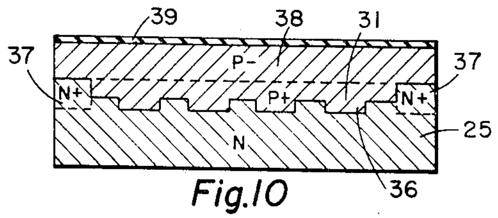
FIGS. 10 and 11 illustrate the formation of a fourth region which diffuses into the closed outer band.
Figure 11:
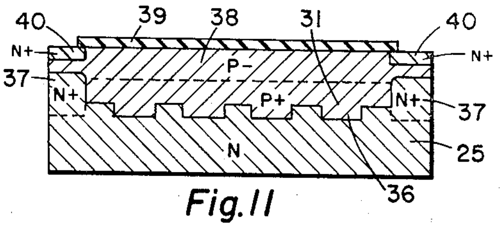
Figure 12:
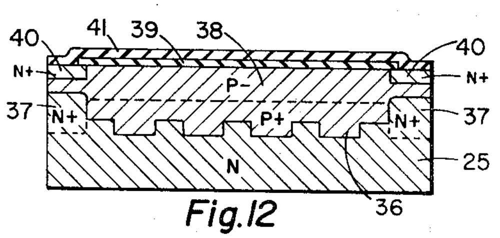
FIGS. 12 and 13 illustrate the formation of a fifth region of opposite conductivity (P+) semiconductor material.

After the formation of the P− portion 38, an oxide coating 39 is grown or deposited on the surface of the structure as shown in FIG. 10. Subsequently the oxide is cut at the exterior edges thereof to permit the diffusion of a fourth region 40 of N+ conductivity into the P− second portion 38. The N+ region 40 diffuses inwardly, and by the process of in-diffusion and out-diffusion the region 40 is integrally formed with and becomes a part of the continuous outer band 37 of the one conductivity type semiconductor material. In FIG. 12 an oxide coating 41 is again formed over the remaining unetched oxide on the surface of the structure and over the N+ region 40, and in FIG. 13 openings are cut in this oxide coating using known photolithographic techniques. The latter step permits the diffusion of a fifth region 43 of opposite conductivity type (P+) semiconductor material into the P− layer 38.

Figure 13:
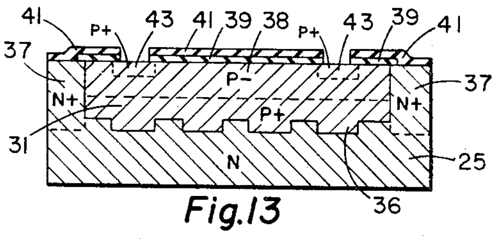
Figure 14:
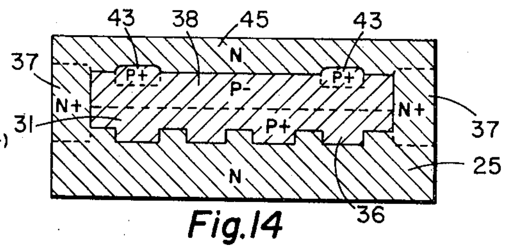
FIG. 14 illustrates the formation of a sixth region of N− epitaxially grown, semiconductor material.
Figure 15:
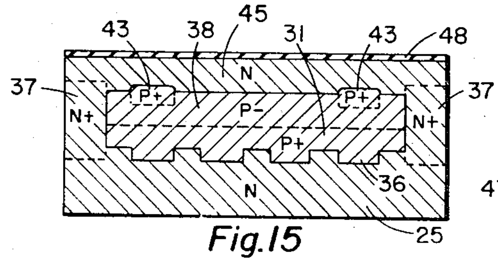
FIGS. 15 and 16 illustrate the formation of a seventh region of N+ semiconductor material which also diffuses into the closed outer band.
Figure 19:
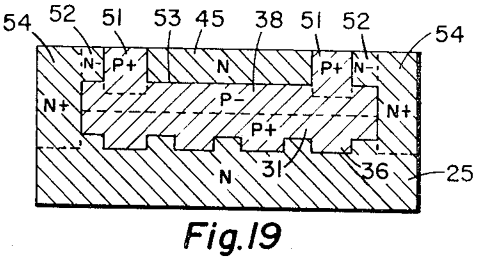
FIG. 19 further shows the completed integrated structure prior to the construction of any integrated circuits or devices therein.

The next step in the process is to remove the oxide coating 41 that is shown in FIG. 13 and thereafter epitaxially grow a sixth region 45 of N type conductivity (N−) as shown in FIG. 14. An oxide coating 48 is then formed over region 45 and openings are cut in this coating to permit the subsequent diffusion of a seventh region 47 of N+ conductivity into region 45. The N+ region 47 eventually diffuses into the N+ outer band 37 to increase the vertical extent thereof as shown in FIG. 19.

Figure 18:
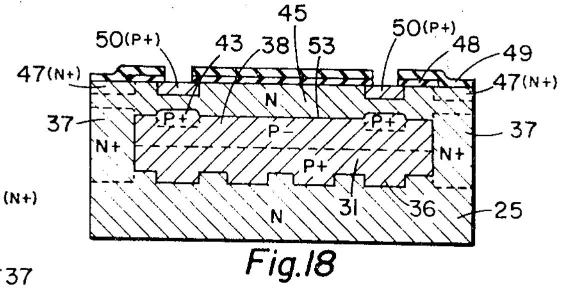
FIGS. 17 and 18 illustrate the formation of an eighth region of P+ semiconductor material which diffuses into the P+ fifth region to form a continuous P+ inner band as shown in FIG. 19.
Figure 16:
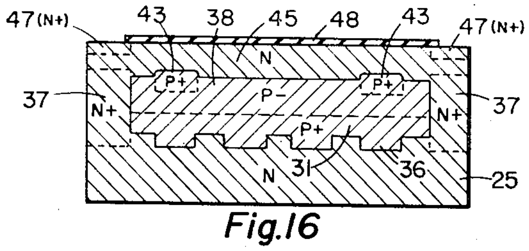
Figure 17:
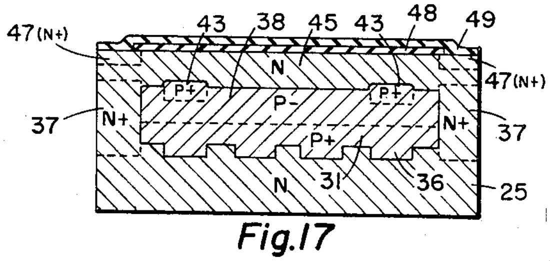

Another oxide coating 49 is then deposited or grown on the oxide coating 48 as shown in FIG. 17, and an eighth region 50 of opposite conductivity type (P+) semiconductor material is diffused through the openings which are cut in this oxide coating (FIG. 18). The in-diffusion and out-diffusion by the regions 50 and 43 and by the regions 47 and 37 respectively results in the P+ and N+ vertical inner and outer bands 51 and 54 as shown in FIG. 19. These concentric annular bands 51 and 54 of P+ and N+ conductivity types extend from within the semiconductor structure to the surface thereof. Conveniently, the P+ and N+ channels 51 and 54 in FIG. 19 are separated by a section 52 of the N-type semiconductor layer 45. This construction prevents the formation of poor P+N+ junction between bands 51 and 54.

Figure 20:
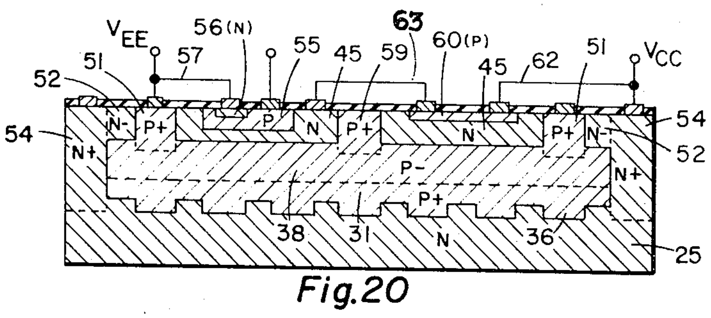
FIGS. 20 and 21 show a simple transistor-resistor integrated circuit which has been constructed in the regions adjacent to surface of the structure shown in FIG. 20.
Figure 21:
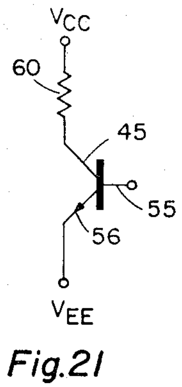

The semiconductor structure according to this invention can be formed with as many isolated sections of the N- surface layer 45 as are necessary for a given integrated circuit application. For example, consider a simple transistor circuit consisting of a transistor and a resistor connected between a source of emitter potential $V_{EE}$ and a source of collector potential $V_{CC}$ (FIG. 21). By adding an additional isolation diffusion to the above described process to form a P+ region 51, the upper N− layer 45 is separated into left and right hand sections which are isolated as shown in FIG. 20. A NPN transistor is then formed in the left hand section and includes base and emitter regions 55 and 56 overlaying the N type collector which is a portion of the layer 45. These regions can be formed, for example, using known double-diffusion techniques. In the right hand section of layer 45 a P type resistor 60 is diffused into the surface of the structure. This resistor is connected via line 62 to collector potential $V_{CC}$ and via line 63 to the collector of the NPN transistor as shown in FIG. 20. Note that the collector potential $V_{CC}$ is brought to the surface of the structure through the outer N+ band 54. The emitter 56 of the NPN transistor is connected via conductor 57 to the emitter potential $V_{EE}$ which is brought to the surface of the structure through the P+ inner band 51. The schematic diagram of the integrated structure in FIG. 20 is shown in FIG. 21.

Figure 22:
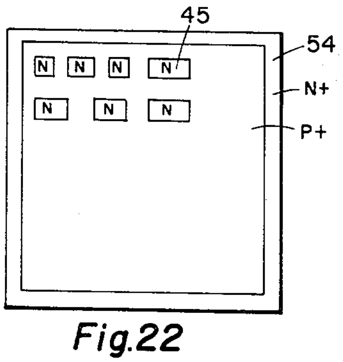
FIG. 22 illustrates the formation of a plurality of isolated surface regions in which transistors, resistors and other devices may be formed.

FIG. 22 illustrates the formation of many isolated sections of the upper N− layer 45. Each of the N− sections may be connected to the N+ and P+ bands 54 and 51 respectively at the surface of the structure, and this system for distributing voltages greatly minimizes the amount of metalization required to electrically connect integrated circuits which are constructed in semiconductor layer 45.

The resistivity ranges for the various semiconductor layers in the table below are listed by way of illustration only and should not be construed as limiting the scope of this invention.

TABLE

| Region | Resisitivity in ohm-centimeters |
|---|---|
| N type substrate 25 | 0.005–0.05 |
| P+ region 31 | 0.01–0.5 |
| P− region 38 | 1.0–5.0 |
| N+ band 54 | 0.01–0.1 |
| P+ band 51 & region 59 | 0.1–0.5 |
| N− epi layer 45 | 1.0–10.0 |

What is claimed is:

1. A process for fabricating a voltage distribution system including the steps of:

diffusing at least one relatively low resistivity first region of a first conductivity type into a semiconductor substrate also of said first conductivity type;

epitaxially depositing a first layer of relatively low resistivity material of a second conductivity type on a surface of said substrate and said first region, said first layer being a first portion of a decoupling capacitor and said semiconductor substrate being a second portion thereof;

diffusing a second relatively low resistivity region of said first conductivity type into a surface of said first layer, said second region being registered directly above said first region;

epitaxially depositing a second layer of semiconductor material of said second conductivity type on said first layer and said second region;

diffusing a relatively low resistivity third region of said first conductivity type into the surface of said third layer, said third region being registered directly above said second region;

diffusing a relatively low resistivity fourth region of said second conductivity type into a surface of said second layer, said fourth region being spaced from said third region;

epitaxially depositing a third layer of semiconductor material of said first conductivity type on a surface of said second layer and said fourth region;

diffusing a relatively low resistivity fifth region of said first conductivity type in a surface of said third layer, said fifth region being registered directly above said third region; and diffusing a relatively low resistivity sixth region of said second conductivity type in said surface of said third layer, said sixth region being registered directly above said fourth region, said first, second, third, and fifth region diffusing inwardly and outwardly during said diffusion steps to form a continuous region of said first conductivity type extending from said semiconductor substrate to said surface of said third layer for distributing thereto a first voltage applied to said semiconductor substrate, said fourth and sixth regions also diffusing inwardly and outwardly during said diffusion steps to form a continuous region of said second conductivity type extending from said surface of said second layer through said third layer to said surface of said third layer and acting to isolate a portion of said third layer and also acting to distribute to said surface of said third layer a second voltage applied to said second layer, the capacitance of the PN junction between said semiconductor substrate and said first layer acting as a decoupling capacitor therebetween.

2. The process as recited in claim 1 further including the steps of diffusing a plurality of relatively low resistivity seventh regions of said second conductivity type in said surface of said semiconductor substrate after diffusing said first region, said plurality of seventh regions forming a castellated segment of said PN junction between said semiconductor substrate and said first layer, increasing the area of said PN junction.

3. The process as recited in claim 1 wherein said first, second, third, and fifth regions form continuous bands.

4. The process as recited in claim 2 wherein each of said plurality of seventh regions form continuous, concentric bands.

5. The process as recited in claim 1 wherein the resistivities of said first, second, third and fifth regions range from 0.01 to 0.1 ohm-centimeters, and the resistivities of said fourth and sixth regions range from 0.1 to 0.5 ohm-centimeters, and the resistivity of said first layer ranges from 0.01 to 0.5 ohm-centimeters, and the resistivity of said second layer ranges from 1.0 to 5.0 ohm-centimeters, and the resistivity of said third layer ranges from 1.0 to 10.0 ohm-centimeters.

* * * * *